(12) United States Patent
Hewitt et al.

(10) Patent No.: US 9,455,037 B2
(45) Date of Patent: Sep. 27, 2016

(54) EEPROM MEMORY CELL WITH LOW VOLTAGE READ PATH AND HIGH VOLTAGE ERASE/WRITE PATH

(71) Applicant: Microchip Technology Incorporated, Chandler, AZ (US)

(72) Inventors: Kent Hewitt, Chandler, AZ (US); Jack Wong, Phoenix, AZ (US); Bomy Chen, Newark, CA (US); Sonu Daryanani, Tempe, AZ (US); Jeffrey A. Shields, Chandler, AZ (US); Daniel Alvarez, Gilbert, AZ (US); Mel Hymas, Camas, WA (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/209,275

(22) Filed: Mar. 13, 2014

(65) Prior Publication Data

US 2014/0269102 A1 Sep. 18, 2014

Related U.S. Application Data (60) Provisional application No. 61/794,758, filed on Mar. 15, 2013.

(51) Int. Cl.
*G11C 11/34* (2006.01)
*G11C 16/04* (2006.01)
*H01L 29/423* (2006.01)
*H01L 29/788* (2006.01)

(52) U.S. Cl.
CPC ..... *G11C 16/0416* (2013.01); *H01L 29/42328* (2013.01); *H01L 29/7881* (2013.01)

(58) Field of Classification Search
CPC .. G11C 16/00; G11C 16/0408; G11C 16/045
USPC ............... 365/185.14, 174, 185.26
See application file for complete search history.

(56) References Cited

U.S. PATENT DOCUMENTS

| 6,101,131 A | 8/2000 | Chang et al. ............ 365/185.33 |
| 8,809,930 B2 * | 8/2014 | Jeon et al. .................. 257/314 |
| 2008/0111181 A1 * | 5/2008 | Park .................. G11C 16/0441 257/319 |

FOREIGN PATENT DOCUMENTS

EP 1069619 A2 1/2001 ............ G11C 16/04

OTHER PUBLICATIONS

Lee, Junghwan et al., "Fabrication and Characterization of a New EEPROM Cell with Spacer Select Transistor," IEEE Electron Device Letters, vol. 26, No. 8, 3 pages, Aug. 2005.
International Search Report and Written Opinion, Application No. PCT/US2014/026440, 17 pages, Aug. 29, 2014.

* cited by examiner

*Primary Examiner* — Han Yang
(74) *Attorney, Agent, or Firm* — Slayden Grubert Beard PLLC (57) ABSTRACT

An electrically erasable programmable read only memory (EEPROM) cell may include a substrate including at least one active region, a floating gate adjacent the substrate, a write/erase gate defining a write/erase path for performing high voltage write and erase operations, and a read gate defining a read path for performing low voltage read operations, wherein the read path is distinct from the write/erase path. This allows for a smaller read gate oxide, thus allowing the cell size to be reduced. Further, the EEPROM cell may include two independently controllable read gates, thereby defining two independent transistors which allows better programming voltage isolation. This allows the memory array to be drawn using a common source instead of each column of EEPROM cells needing its own source line. This makes the array more scalable because the cell x-dimension would otherwise be limited by each column needing two metal 1 pitches.

26 Claims, 7 Drawing Sheets

EEPROM MEMORY CELL WITH LOW VOLTAGE READ PATH AND HIGH VOLTAGE ERASE/WRITE PATH

CROSS-REFERENCE TO RELATED APPLICATIONS

This application claims the benefit of U.S. Provisional Application No. 61/794,758 filed on Mar. 15, 2013, which is incorporated herein in its entirety.

TECHNICAL FIELD

The invention relates to semiconductor based memory cells, e.g., EEPROM memory cells.

BACKGROUND

Figure 1:
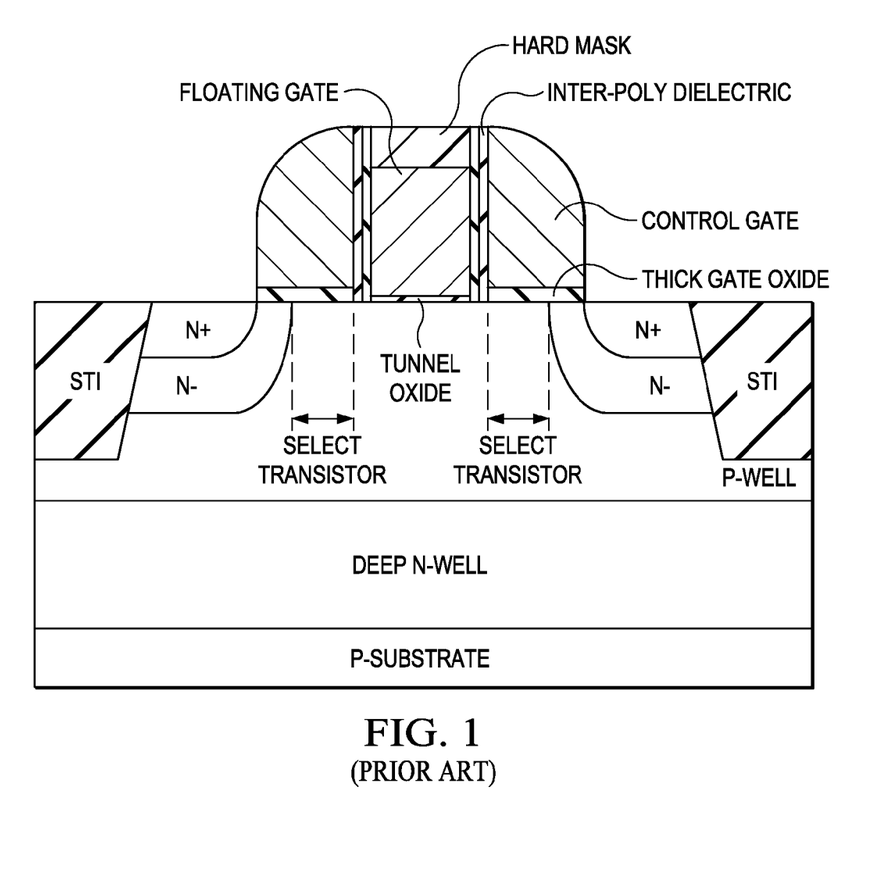
FIG. 1 shows a prior art EEPROM cell design.

FIG. 1 illustrates a prior art electrically erasable programmable read only memory cell, as illustrated and described in *Fabrication and Characterization of a New EEPROM Cell With Spacer Select Transistor*, by Junghwan Lee et al., IEEE Electron Device Letters, Vol. 26, No. 8, August 2005, which article is hereby incorporated by reference in its entirety.

As described in Junghwan Lee et al., the cell has spacer select gates (labelled as "control gate" in FIG. 1) on both side walls of floating gate, which helps result in a very small cell size as well as relief of topology during contact formation. The cell size is 0.95 $\mu m^2$ with 0.18 $\mu m$ logic process. The cells are programmed and erased by Fowler-Nordheim tunneling. Programming requires 3 ms at 16 V, while erasing requires 2 ms at 14 V. The operating voltages for selected and unselected cells are shown in Table 1.

TABLE 1

Bias condition during programming (writing), erasing, and reading, for both selected and unselected cells configured as shown in FIG. 1.

|  |  | Program/Write | Erase | Read |
|---|---|---|---|---|
| Control Gate | Selected | 16 V | 0 V | 2.5 V |
|  | Unselected | 2.5 V | 11 V | 0 V |
| Bit Line | Selected | 0 V | 14 V | 1.0 V |
|  | Unselected | 12 V | 11 V | 0 V |
| P-Well | Selected | 0 V | 14 V | 0 V |
|  | Unselected | 0 V | 0 V | 0 V |
| Source | Selected | Floating | Floating | 0 V |
|  | Unselected | Floating | Floating | 0 V |

As illustrated by Table 1, the junctions of this known cell operate at relatively high voltages (12V-16V). This means that the junctions underneath the control gate spacers (control gate) are relatively large and deep, and the gate oxide under the gate spacers (control gate) is relatively thick, in particular much thicker than the tunnel oxide underneath the floating gate. This relatively large thickness of the control gate oxide resists the flow of read current, such that the dimension of the cell into the page must be kept relatively large. Thus, the size of this memory cell cannot be easily scaled down to smaller geometries, while still providing sufficient read current.

SUMMARY

One embodiment provides an electrically erasable programmable read only memory (EEPROM) cell that may include a substrate including at least one active region, a floating gate adjacent the substrate, a write/erase gate defining a write/erase path for performing high voltage write and erase operations of the cell, and a read gate defining a read path for performing low voltage read operations of the cell, wherein the read path is distinct from the write/erase path.

In a further embodiment, the write/erase gate is formed over the floating gate, and the read gate is formed laterally adjacent the floating gate and write/erase gate.

In a further embodiment, the EEPROM cell includes a floating gate oxide between the floating gate and the substrate, and a read gate oxide between the read gate and the substrate, wherein the read gate oxide is thinner than the floating gate oxide.

In a further embodiment, the write/erase path defined by the write/erase gate is configured for high voltage write and erase operations, and the read path defined by the read gate is configured for low voltage read operations.

In a further embodiment, the read gate is formed laterally adjacent the floating gate, and an active region of the substrate is self-aligned with the read gate.

In a further embodiment, the read gate includes first and second portions formed on opposite sides of the floating gate, such that the floating gate is arranged between the first and second portions of the read gate.

In a further embodiment, the EEPROM cell includes first and second read gates that are independently-addressable.

In a further embodiment, the first read gate is formed adjacent a first lateral side of the floating gate, and the second read gate is formed adjacent a second lateral side of the floating gate.

Another embodiment provides a method of operating an electrically erasable programmable read only memory (EEPROM) cell having a substrate including at least one doped well, a floating gate formed over the substrate, a low voltage read path defined by a read gate, and a separate high voltage write/erase path defined by a write/erase gate distinct from the at least one read gate. The method may include performing a write operation to charge the floating gate by creating a high voltage differential between the write/erase gate and the at least one doped well, and performing a read operation to read the charge on the floating gate by creating a low voltage differential between the read gate and the at least one doped well. The method may also include performing an erase operation to discharge the floating gate by creating a high voltage differential between the at least one doped well and the write/erase gate.

In a further embodiment of the method, the EEPROM cell is an n-channel cell comprising at least one p-well, and the method includes performing the read operation to read the charge on the floating gate by applying a low read voltage bias to the write/erase gate while grounding the at least one p-well; performing the write operation to charge the floating gate by applying a high write voltage bias to the write/erase gate while grounding the at least one p-well; and performing an erase operation to discharge the floating gate by applying a high erase voltage bias to the at least one p-well while grounding the write/erase gate, wherein the high erase voltage bias may be the same or different voltage than the high write voltage bias.

In a further embodiment of the method, the EEPROM cell is a p-channel cell comprising at least one n-well, and the method includes performing the read operation to read the charge on the floating gate by applying a low read voltage bias to the at least one n-well while grounding the write/erase gate; performing the write operation to charge the floating gate by applying a high write voltage bias to the at least one n-well while grounding the write/erase gate; and performing an erase operation to discharge the floating gate by applying a high erase voltage bias to the write/erase gate while grounding the at least one n-well, wherein the high erase voltage bias may be the same or different voltage than the high write voltage bias.

In a further embodiment of the method, the EEPROM cell includes first and second read gates, and wherein the method comprises independently biasing the first and second read gates. In a further embodiment, the first and second read gates comprise poly spacers located on opposite lateral sides of the floating gate.

Another embodiment provides a memory cell array including a plurality of electrically erasable programmable read only memory (EEPROM) cells arranged in an array, each EEPROM cell comprising a substrate including at least one active region, a floating gate adjacent the substrate, a write/erase gate defining a write/erase path for performing write and erase operations of the cell, and a read gate defining a read path for performing read operations of the cell, wherein the read path is distinct from the write/erase path.

BRIEF DESCRIPTION OF THE FIGURES

Example embodiments are discussed below with reference to the drawings, in which.

DETAILED DESCRIPTION

Embodiments of the present invention may include one or more key improvements to the known memory cell design shown in FIG. 1 and discussed above. For example, some embodiments provide an EEPROM cell including a high voltage write/erase gate separate from a low voltage read gate, in addition to the floating gate. The write/erase gate may be formed over and insulated from the floating gate, while the read gate (or gates) may be formed as poly spacer on the lateral sides of the floating gate. A much thinner spacer oxide may be used underneath the read gate, as compared with the known design shown in FIG. 1. As a result, the memory cell junctions may operate at much lower voltages (e.g., 3.3 V) instead of the higher voltages of the known design, as the thinner oxide has a better transconductance.

As another example, in some embodiments, dummy cells may be provided in a row or column of memory cells to improve electrical contact between control gate contacts and poly spacers (read gates). As another example, in some embodiments, the two poly spacers of a particular cell may be configured for independent operation, e.g., by physically separating the two poly spacers using a suitable mask and etch process.

Figure 2:
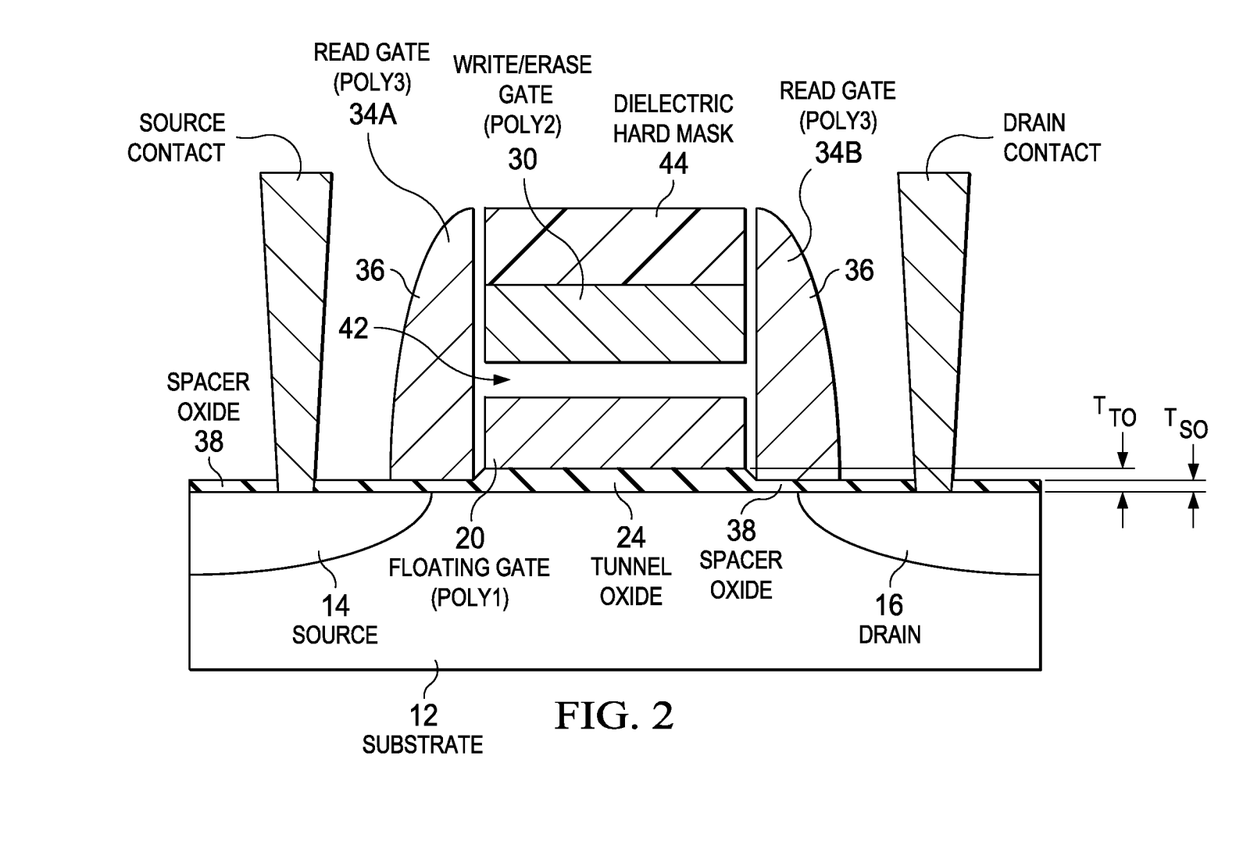
FIG. 2 illustrates an example EEPROM cell, according to one embodiment.

FIG. 2 illustrates an example EEPROM cell 10, according to one embodiment. As shown, EEPROM cell 10 includes a substrate 12 including an active source region 14 separated from an active drain region 16, a floating gate 20 formed over a tunnel oxide 24 on substrate 12, a high-voltage write/erase gate 30 formed over and insulated from the floating gate 20, and low-voltage read gate regions 34A and 34B formed over a spacer oxide 38 on substrate 12. Floating gate 20, write/erase gate 30, and read gate regions 34A and 34B (poly spacers) are also referred to herein as "poly 1," "poly 2," and "poly 3," respectively, due to the order in which such regions would typically be formed. It should also be understood that cell 10 may be formed as either an n-channel or p-channel cell, using any suitable manufacturing/fabrication techniques.

As shown, read gate regions 34A and 34B may be formed as spacer select poly gates adjacent the lateral sides of the floating gate 20 and write/erase gate 30. Source and drain regions 14 and 16 may be formed self-aligned with read gate regions 34A and 34B. In some embodiments, read gate regions 34A and 34B are conductively connected (e.g., at the end of a cell row) and thus held at the same voltage, such that gates 34A and 34B act as a single control gate 36. In other embodiments, e.g., as discussed below with reference to FIGS. 8A-8B, read gate regions 34A and 34B are isolated from each other, and thus independently controllable, thereby defining two independent control gates 34. The following discussion thus refers to control gate(s) 36 to refer to both alternatives (i.e., one or two read gates).

The write/erase gate 30 defines a write/erase path for performing high-voltage write and erase operations of the cell 10, while each read gate 36 defines a read path for performing read operations of the cell 10, each read path being distinct from the write/erase path.

As used herein, the terms "high voltage" and "low voltage" are intended as relative terms. Thus, "high voltage" refers to a greater voltage than "low voltage." In some embodiments, high voltage operations of a cell (e.g., write/erase operations) involve a voltage bias at least 50% greater than low voltage operations of the cell (e.g., read operations). For example, in some embodiments, high voltage operations of a cell (e.g., write/erase operations) may involve a voltage bias at least 100% greater than low voltage operations of the cell (e.g., read operations). As another example, in some embodiments, embodiments, high voltage operations of a cell (e.g., write/erase operations) involve a voltage bias at least 300% greater than low voltage operations of the cell (e.g., read operations). As another example, in some embodiments, embodiments, high voltage operations of a cell (e.g., write/erase operations) involve a voltage bias at least 500% greater than low voltage operations of the cell (e.g., read operations).

In some embodiments, high voltage operations of a cell (e.g., write/erase operations) involve a voltage bias above 8V, while low voltage operations of the cell (e.g., read operations) involve a voltage bias below 8V. For example, in some embodiments, high voltage operations of a cell (e.g., write/erase operations) involve a voltage bias between about 10V and about 16V, while low voltage operations of the cell (e.g., read operations) involve a voltage bias below 5V (e.g., about 3.3V or about 1.8V).

Separating the high-voltage write/erase operations from the low-voltage read operations by adding the separate write/erase gate 30 over the floating gate 20 allows the thickness of the spacer oxide 38 underneath the read gate regions 34A and 34B to be reduced in the direction indicated as $T_{SO}$, as well as in the direction into the page. In some embodiments, the spacer oxide thickness $T_{SO}$ may be less than the tunnel oxide thickness $T_{TO}$. In various example embodiments, the spacer oxide thickness $T_{SO}$ may be less than 90%, less than 70%, less than 50%, or less than 30% of the tunnel oxide thickness $T_{TO}$. For example, in an embodiment that uses a tunnel oxide 24 with a thickness $T_{TO}$ of 93 Å underneath the floating gate 20, the spacer oxide thickness $T_{SO}$ can be about 73 Å. This allows the memory cell junctions and read path to operate at much lower voltages (e.g., 3.3V) instead of the higher voltages of the previous design, as the thinner oxide has a better trans-conductance. As another example, a spacer oxide thickness $T_{SO}$ of about 35 Å may be used, which allows the memory cell junctions and read path to operate at even lower voltages (e.g., 1.8V).

As shown, high-voltage poly gate 30 is formed over and insulated from the floating gate 20 by an inter-poly dielectric regions 42, which poly gate 20 may be used for write and erase functions. The write/erase gate handles the high voltage operation of cell 10 while leaving the read gate(s) 36 to handle the lower-voltage operation of the cell, thus allowing a thinner spacer oxide 38 as discussed above, as well as a smaller depth for the source/drain junctions 14 and 16. A dielectric hard mask 44 is added over the poly gate for providing an isolation metal contact landing on the WL-spacer (read gate) so that these contacts will not short to the poly 2 write/erase gate (see FIGS. 8A and 8B).

The features discussed above allow for the memory cell 10 to be scaled to much smaller dimensions as compared with the known cell design, thus greatly reducing the memory cell area while maintaining a high read current. For example, cell 100 transistor size width may be reduced from w=0.4 μm to w=about 0.25 μm or less and length (including the floating gate) may be reduced from l=0.9 μm to l=about 0.75 μm or less. Thus in some embodiments the transistor area portion of the cell may be reduced by at least 40% or by at least 50%, as compared with a conventional cell such as shown in FIG. 1. In particular example embodiments the transistor area portion of the cell may be reduced by about 40% to 60%, and in some embodiments about 50%, as compared with a conventional cell. Other embodiments may provide different amounts of cell area reduction. Further, by having low junction voltages, the active overlap of contact can also be reduced as well as the contact to poly distance. These features also allow for scaling with finer geometry processes, because the active area and select transistor are now operating at low voltages. The memory cell design maintains the high endurance and high reliability of the memory cell. Finally, the memory cell design can eliminate the conventional requirement of separate source lines (i.e., columns in the array), as discussed below.

Example n-Channel Cell Operation

As mentioned above, cell 10 may be formed as either an n-channel or p-channel cell. Table 2 shows example operating voltages for an n-channel version of cell 10 formed with a single read gate 36, for selected and unselected states.

TABLE 2

Example bias conditions for writing, erasing, and reading, for selected and unselected states of an example n-channel cell 10.

| | | Program/Write | Erase | Read |
|---|---|---|---|---|
| Read Gate | Selected | Vdd | 11 V-13 V | Vdd |
| | Unselected | 0 V | 11 V-13 V | 0 V |
| Write/Erase Gate | Selected | 15 V | 0 V | Vread |
| | Unselected | 4 V | 11 V | Vread |
| Bit Line | Selected | 0 V | Float = 15 V | 1 V-Vdd |
| | Unselected | Vdd | Float = 15 V | 0 V |
| Source Line | Selected | Float = 0 V | Float = 15 V | 0 V |
| | Unselected | Vdd | Float = 15 V | 0 V |
| P-Well | Common | 0 V | 15 V | 0 V |

Thus, according to Table 2, the n-channel cell can be programmed (write) by applying a high voltage to the write/erase gate 30 while grounding the p-well, and erased by applying high voltage to the well and junctions simultaneously while grounding the write/erase gate 30. Supply voltage Vdd may be 3.3V or about 3.3V, for example. The read bias applied to the write/erase gate, Vread, can be centered in the cell program/erase window, and may be close to Vdd for the n-channel cell, as a read operation involves the write/erase gate 30 coupling the floating gate 20 high enough to turn on an erased memory cell into a conductive state (e.g., 1V), but not so high as to turn a written memory cell into a conductive state (e.g., 3.5V).

Figure 3:
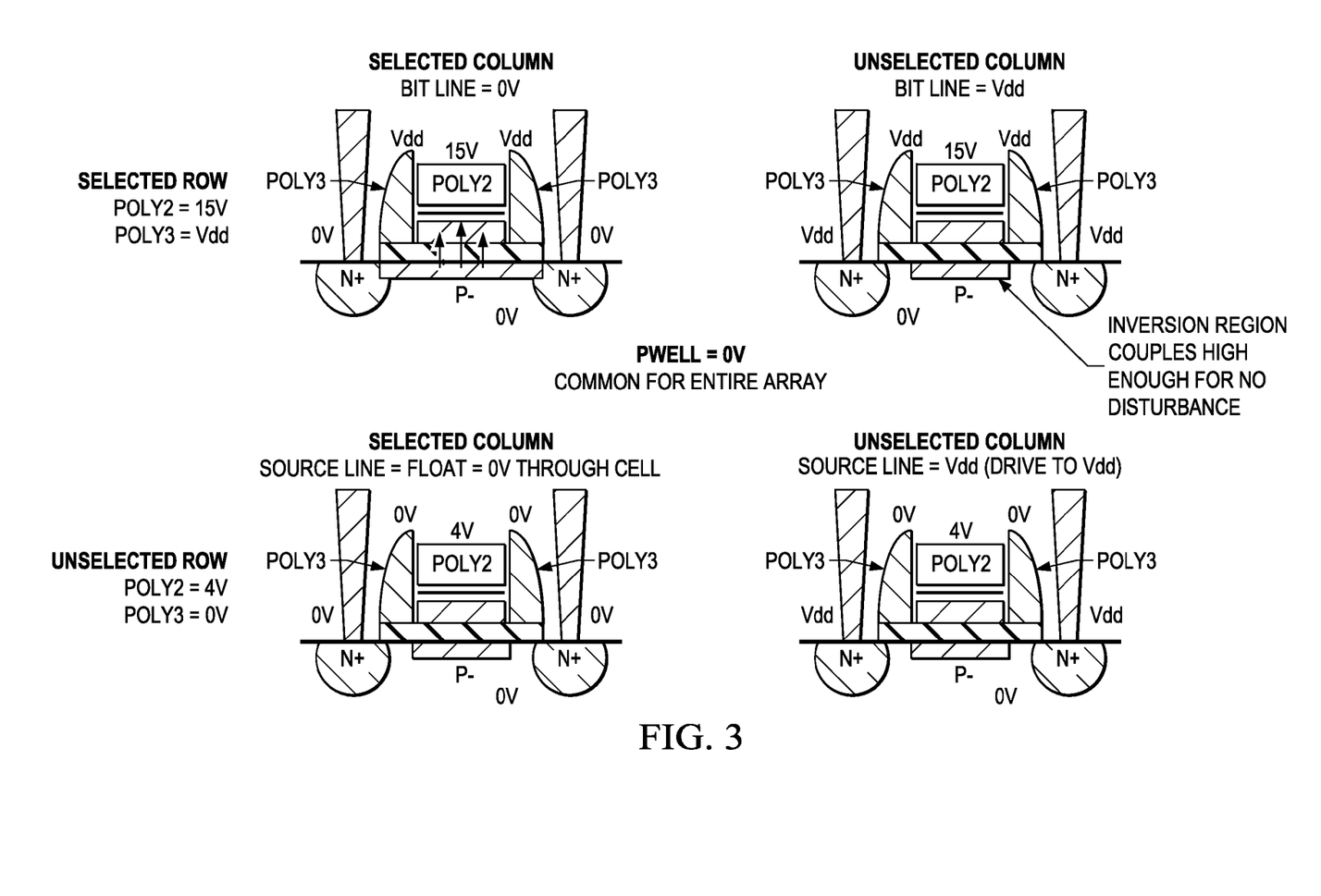
FIG. 3 shows example biasing conditions for programming an n-channel EEPROM cell, according to one embodiment.
Figure 4:
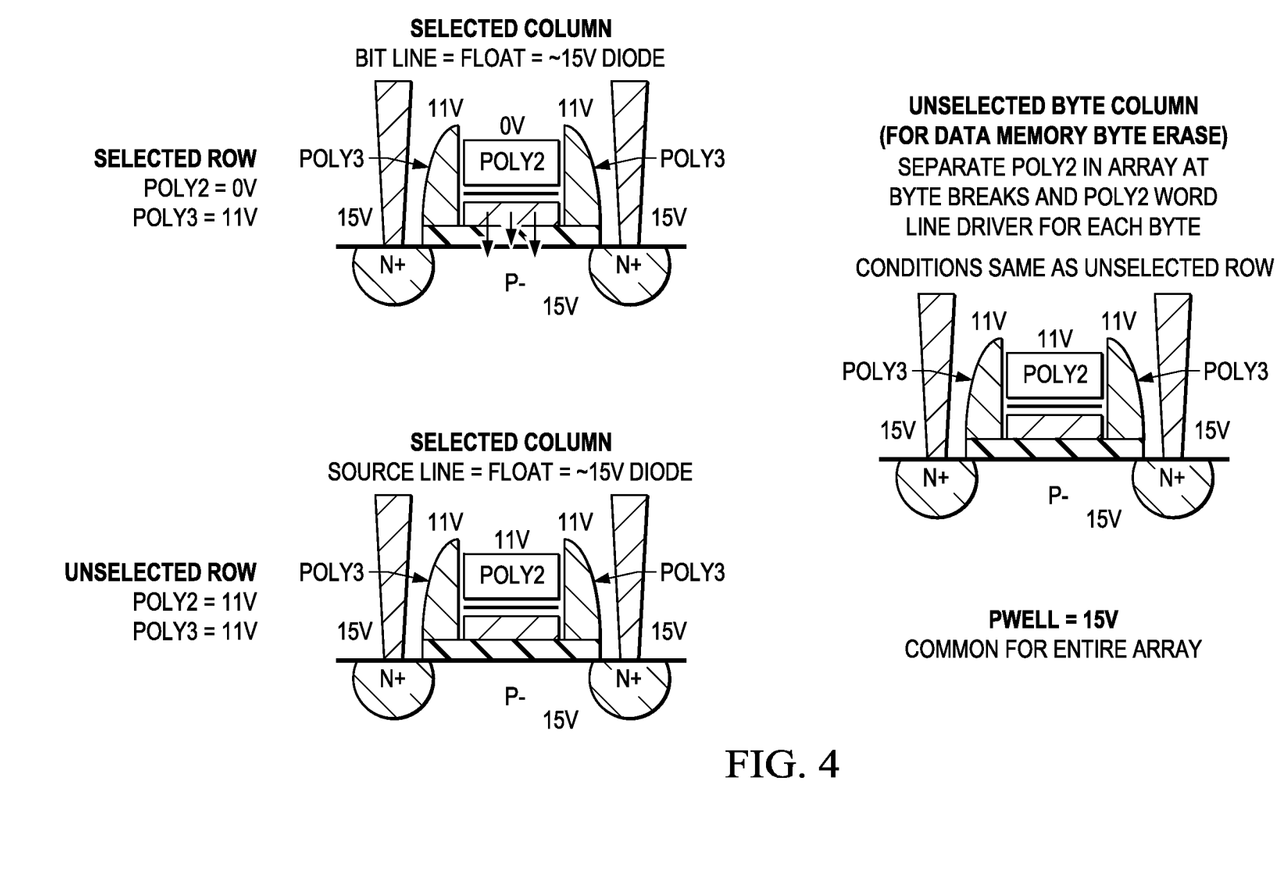
FIG. 4 shows example biasing conditions for erasing an n-channel EEPROM cell, according to one embodiment.

FIG. 3 shows the bias conditions for programming the n-channel cell, based on Table 2, while FIG. 4 shows the bias conditions for erasing the n-channel cell, again based on Table 2. As shown in FIG. 3, with the cell row being selected and cell column unselected, the inversion region is used to couple high enough (e.g., 8V) to avoid program disturb. That is, in some embodiments, if the electric field between the floating gate 20 (which will couple high when the 15V program voltage is applied to the poly2 write/erase gate 30) to the substrate 12 is more than about 5-6V for a 93 Å tunnel oxide, then program disturb will occur because electrons will tunnel from the inversion region up to the floating gate increasing its threshold voltage. Therefore the inversion region needs to be coupled high (e.g., 8V) to reduce the electric field so that no program disturb occurs.

Example p-Channel Cell Operation

A p-channel version of cell 10 can be formed by changing the p-well of the cell array to n-well, with p+ doped source and drain regions 14 and 16. Table 3 shows example operating voltages for a p-channel version of cell 10 formed with a single read gate 36, for selected and unselected states.

TABLE 3

Example bias conditions for writing, erasing, and reading, for selected and unselected states of an example p-channel cell 10.

| | | Program/Write | Erase | Read |
|---|---|---|---|---|
| Read Gate | Selected | 13 V | 0-Vdd | 0 V |
| | Unselected | 15 V | 0-Vdd | Vdd |
| Write/Erase Gate | Selected | 0 V | 15 V | Vread |
| | Unselected | 13 V | 0 V | Vread |
| Bit Line | Selected | 15 V | Float = 0 V | 0 V to Vdd-1 V |
| | Unselected | 13 V | Float = 0 V | Vdd |
| Source Line | Selected | Float = 15 V | Float = 0 V | Vdd |
| | Unselected | 13 V | Float = 0 V | Vdd |
| N-Well | Common | 15 V | 0 V | Vdd |

Thus, according to Table 3, the p-channel cell can be programmed (write) by applying high voltage to the well and junctions simultaneously while grounding the write/erase gate 30, and erased by applying a high voltage to the write/erase gate 30 while grounding the N-well. Supply voltage Vdd may be 3.3V or about 3.3V, for example. As with the n-channel cell discussed above, the read bias applied to the write/erase gate, Vread, can be centered in the cell program/erase window, and may be close to 0V for the p-channel cell.

Figure 5:
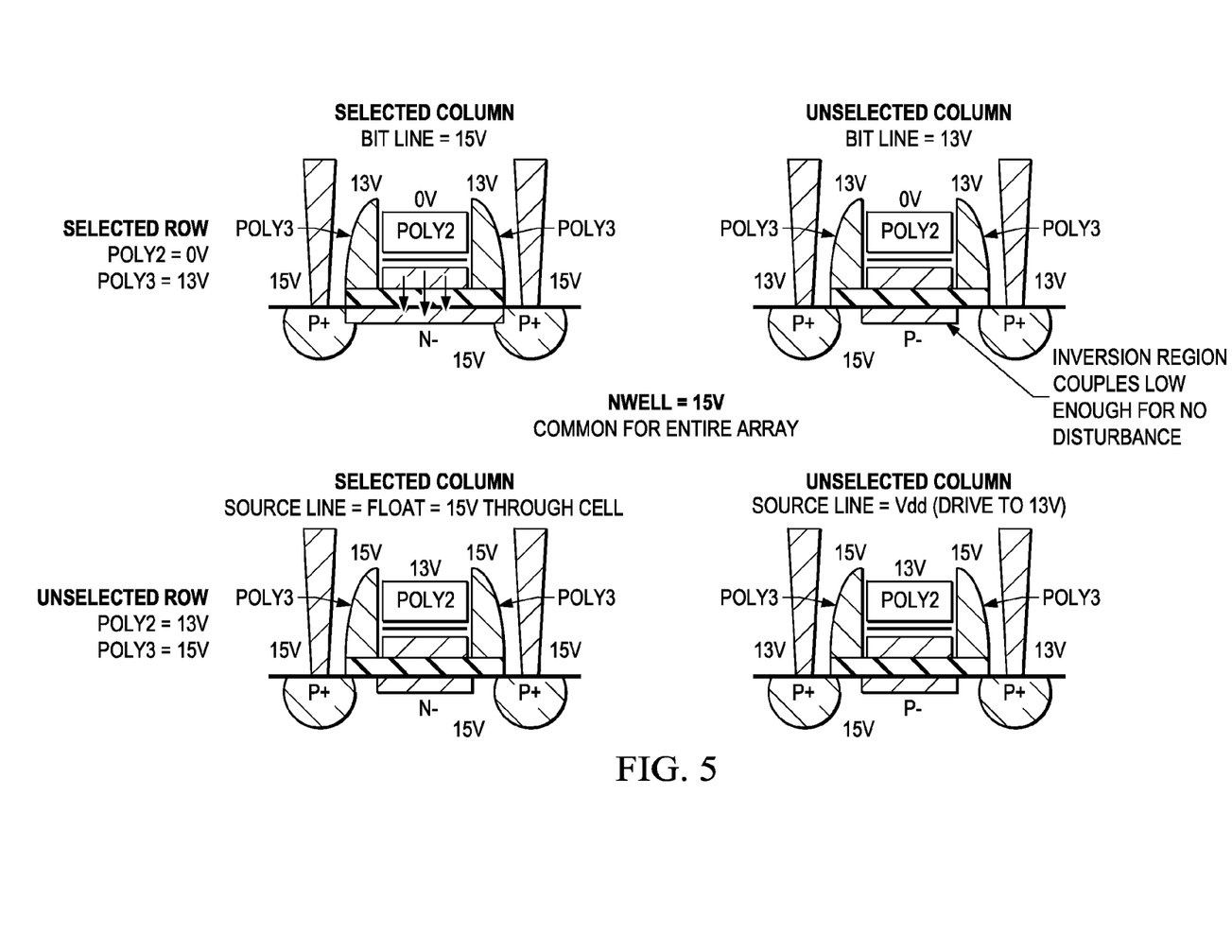
FIG. 5 shows example biasing conditions for programming a p-channel EEPROM cell, according to one embodiment.
Figure 6:
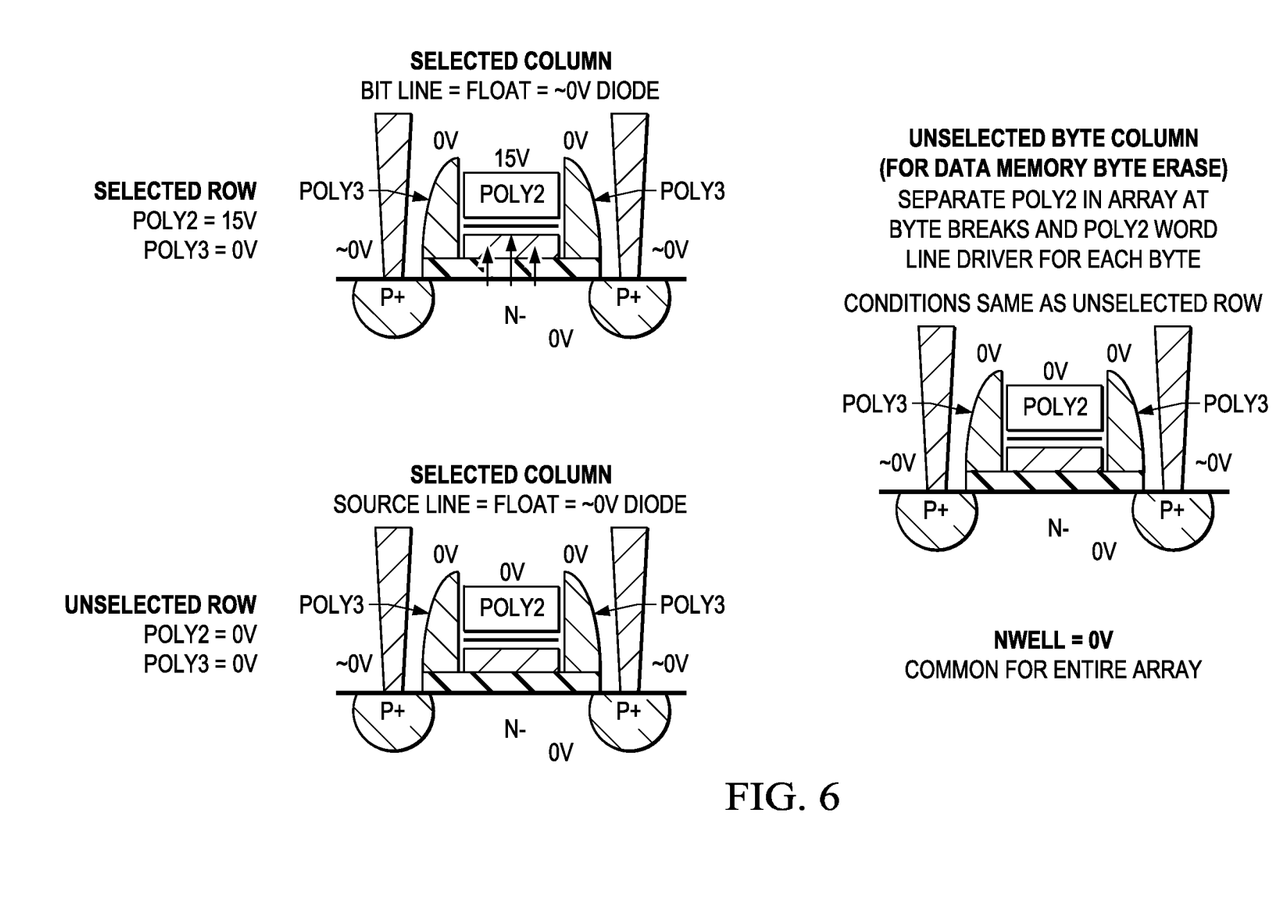
FIG. 6 shows example biasing conditions for erasing a p-channel EEPROM cell, according to one embodiment.

FIG. 5 shows the bias conditions for programming the p-channel cell, based on Table 3, while FIG. 6 shows the bias conditions for erasing the p-channel cell, again based on Table 3. As shown in FIG. 5, with the cell row being selected and cell column unselected, counting on the inversion region to couple low enough (e.g., 7V) to prevent program disturb.

Control Gate Contacts

Some embodiments may also provide improved control gate contacts for contacting the poly spacers, i.e., read gate regions 34A and 34B. In some embodiments, the poly spacers extend across all the columns of memory cells in the particular row of the cell array, with a control gate contact making electrical contact with the poly spacers at every 128 cells. As the size of the memory cells is reduced, including providing thinner poly spacers, it may be more difficult to reliably make the control gate contacts. Thus, the cell array may include one or more "dummy cells" at which the effective width of the poly spacers is enlarged to provide a better location with a greater tolerance for forming the control gate contacts.

Figure 7:
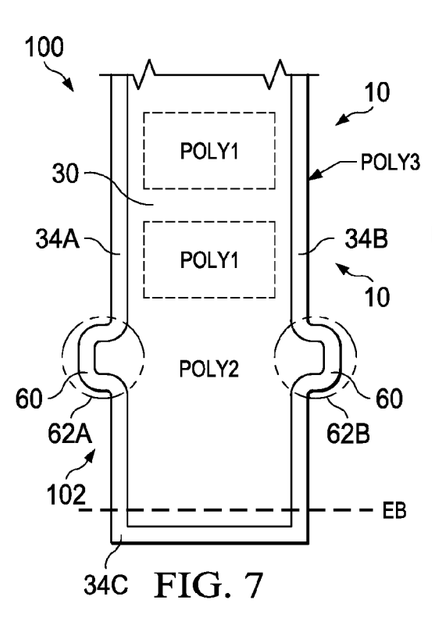
FIG. 7 shows a top view of a portion of an example memory cell array including a dummy cell for connecting control gate contacts with respective poly spacer gates.

FIG. 7 shows a portion of an example cell array 100 including a dummy cell 102 in which the poly spacers 34A and 34B are formed with a bent, or winding, shape in order to provide an increased contact area for electrical contact with control gate contacts 62A and 62B formed over poly spacers 34A and 34B, respectively. In other embodiments, the poly spacers 34A and 34B may have any other bent, curved, or winding path to provide an increased contact area for control gate contacts, or may simply be formed with an increased width as compared with read gate regions 34A and 34B of usable memory cells in the array. Such dummy cells can be located at any suitable location, e.g., at the ends of the rows, and/or interspersed within the array.

Independently Controllable Poly Spacer Gates (Read Gates)

In the embodiment shown in FIG. 7, the read gate regions (poly spacers) 34A and 34B for each row of memory cells 10 is connected by poly spacer end region 34C at the end of the row, and thus read gate regions 34A and 34B are tied together such that are always held to the same voltage, thereby defining a single read control gate.

In other embodiments, the two read gate regions 34A and 34B for each row of memory cells may be physically separated and independently controlled, i.e., the two read gate regions 34A and 34B can be held at different voltages, which may provide advantageous functionality. For example, the poly spacers 34A and 34B can be formed in a single step whereby they are connected at the ends via a poly spacer end region 34C (see FIG. 7), and then separated by a selective etch to remove the poly spacer end region 34C, thereby isolating the two poly spacers 34A and 34B from one another.

Figure 8A:
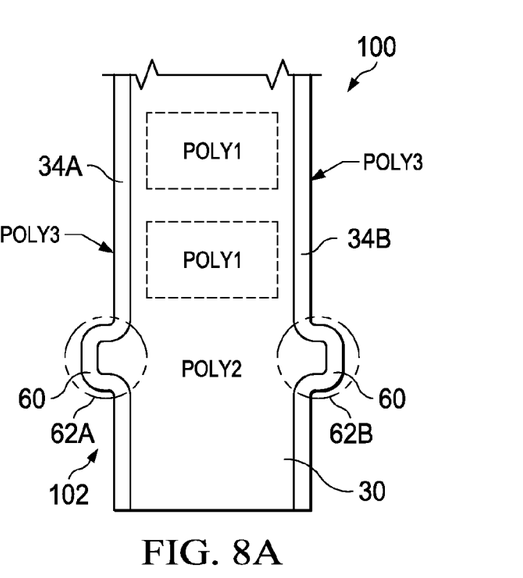
FIG. 8A shows a top view of a portion of an example memory cell array similar to FIG. 7, but with a poly spacer end region etched away to isolate the two poly spacer gate regions from each other.
Figure 8B:
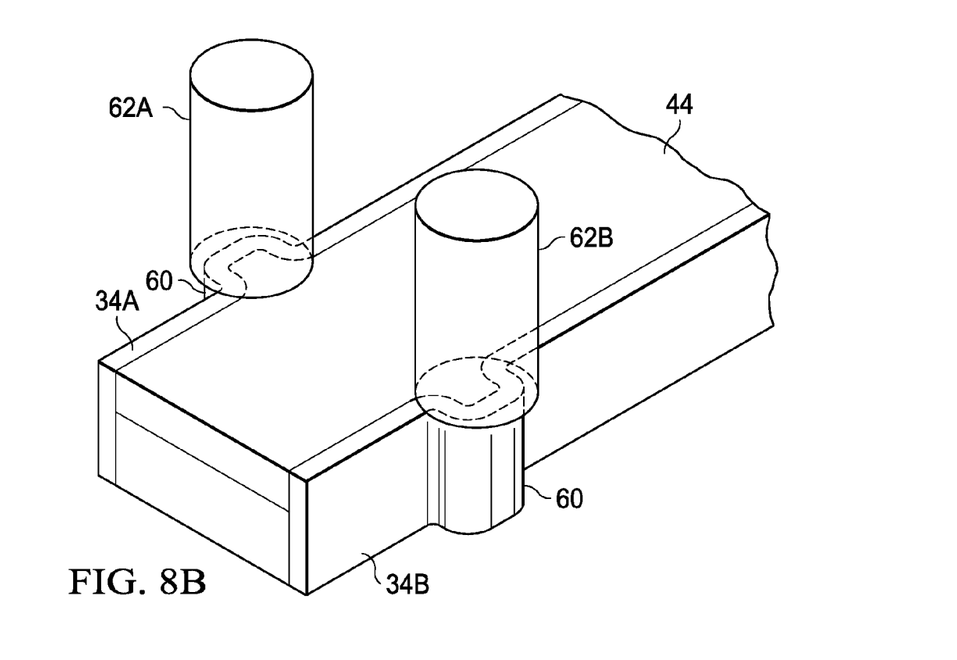
FIG. 8B shows a three-dimensional view of the memory cell array portion shown in FIG. 8A.

FIGS. 8A and 8B illustrate a portion of an example cell array 100 similar to that of FIG. 7, but with the poly spacer end region 34C removed by a selective etch process at etch border EB shown in FIG. 7, thereby isolating gate regions 34A and 34B from each another. This configuration essentially provides for two independent transistors which can be used to isolate the write voltages without the need for separate column source lines (as discussed below). FIGS. 8A and 8B also show a dummy cell 102 for improved connection to control gate contacts 62A and 62B.

Common Source Line

Further, in some embodiment, a common source feature can further facilitate the scaling down of the memory cell size. The prior art memory cell described above (see FIG. 1) requires that each column of memory cells in the memory array has a separate bit line and also a separate source line. This is required because when one cell in the selected row is programmed, its bit line is biased at 0V and unselected cells in the row have their bit lines biased at a higher voltage (e.g., 12V). Because the row is selected, both selected and unselected cells are in a conductive state, which without separate source lines would short the bit lines. This is apparent in the bias tables shown above where, during program (write), the source lines for selected and unselected cells perform different functions. In Table 1 above for the prior art memory cell, the source lines for both selected and unselected are floating independently and will go to different voltages depending on the bit line voltage during program (write). Thus, in the prior art design, two metal routes are required for each column of memory cells in the array, so that the minimum cell area is limited by the metal pitch of the technology.

In contrast, in some embodiments of the present disclosure, the conduction paths between the selected column (to program) and unselected column (to not program) are separated such that the two different voltage potentials applied to the bit lines are not shorted out. This isolation can be achieved by biasing the source-side poly spacer (e.g., read gate 34A shown in FIG. 2) to keep the source-side transistor off during program. This allows the source side of the cell to share a common node with other bits in the same row and eliminates the need for column decoded source lines. Thus, similar to an EPROM or flash array, the source is shared between all bits common to two or more rows, and each column only needs a separate bit line (i.e., one metal route in the array).

To achieve this result, the n-channel biasing table shown above, Table 2, is modified to include two poly 3 rows of values, i.e., one for each of the two poly 3 gates for each column of memory cells, referred to as poly 3A and poly 3B. Poly 3A corresponds to the bit line junction and has the same values as shown for poly 3 in Table 2, while poly 3B corresponds to the source line junction and is common for both selected and unselected rows. An example of the resulting bias conditions for this cell are shown in Table 4.

TABLE 4

Example bias conditions for writing, erasing, and reading, for selected and unselected states of an example n-channel array with shared source line.

|  |  | Program/Write | Erase | Read |
|---|---|---|---|---|
| Poly 3A | Selected | Vdd | 11 V-13 V | Vdd |
|  | Unselected | 0 V | 11 V-13 V | 0 V |
| Poly 3B | Selected | 0 V | 11 V-13 V | Vdd |
|  | Unselected | 0 V | 11 V-13 V | 0 V |
| Write/Erase Gate | Selected | 15 V | 0 V | Vread |
|  | Unselected | 4 V | 11 V | Vread |
| Bit Line | Selected | 0 V | Float = 15 V | 1 V-Vdd |
|  | Unselected | Vdd | Float = 15 V | 0 V |
| Source Line | Common | 0 V | Float = 15 V | 0 V |
| P-Well | Common | 0 V | 15 V | 0 V |

Although the disclosed embodiments are described in detail in the present disclosure, it should be understood that various changes, substitutions and alterations can be made to the embodiments without departing from their spirit and scope.

The invention claimed is:

1. An electrically erasable programmable read only memory (EEPROM) cell, comprising:
    a substrate including at least one active region;
    a floating gate above the substrate;
    a write/erase gate arranged above the floating gate and defining a write/erase path for performing write and erase operations of the cell; and
    a read gate arranged above the substrate and laterally adjacent to the floating gate and the write/erase gate, the read gate defining a read path for performing read operations of the cell, wherein the read path is distinct from the write/erase path,
    a floating gate oxide between the floating gate and the substrate; and
    a read gate oxide between the read gate and the substrate; wherein the read gate oxide is thinner than the floating gate oxide.

2. The EEPROM cell of claim 1, wherein:
    the write/erase gate and the floating gate form a stack and wherein the read gate has a vertical extension extending beyond the vertical extension of the stack.

3. The EEPROM cell of claim 2, comprising:
    a dielectric hard mask covering the write/erase gate wherein the read gate extends to a top surface of the dielectric hard mask.

4. The EEPROM cell of claim 1, wherein:
    the write/erase path defined by the write/erase gate is configured for high voltage write and erase operations; and
    the read path defined by the read gate is configured for low voltage read operations.

5. The EEPROM cell of claim 1, wherein:
    an active region of the substrate is self-aligned with the read gate.

6. The EEPROM cell of claim 1, wherein the read gate includes first and second portions formed on opposite sides of the floating gate, such that the floating gate is arranged between the first and second portions of the read gate.

7. The EEPROM cell of claim 1, comprising first and second read gates that are independently controllable.

8. The EEPROM cell of claim 7, wherein:
    the first read gate is formed adjacent a first lateral side of the floating gate; and the second read gate is formed adjacent a second lateral side of the floating gate.

9. A method of operating an electrically erasable programmable read only memory (EEPROM) cell having a substrate including at least one doped well, a floating gate formed over the substrate, a low voltage read path defined by a read gate being arranged above the substrate and laterally adjacent to the floating gate and the write/erase gate, and a separate high voltage write/erase path defined by a write/erase gate distinct from the at least one read gate, wherein the write/erase gate is arranged above the floating gate, and the read gate is arranged above the substrate and laterally adjacent to the floating gate and the write/erase gate, and further comprising a floating gate oxide between the floating gate and the substrate, and a read gate oxide between the read gate and the substrate, wherein the read gate oxide is thinner than the floating gate oxide, the method comprising:
    performing a write operation to charge the floating gate by creating a high voltage differential between the write/erase gate and the at least one doped well; and
    performing a read operation to read the charge on the floating gate by creating a low voltage differential between the read gate and the at least one doped well.

10. The method of claim 9, further comprising performing an erase operation to discharge the floating gate by creating a high voltage differential between the at least one doped well and the write/erase gate.

11. The method of claim 9, wherein the EEPROM cell is an n-channel cell comprising at least one p-well, and the method comprises:
    performing the read operation to read the charge on the floating gate by applying a low read voltage bias to the write/erase gate while grounding the at least one p-well;
    performing the write operation to charge the floating gate by applying a high write voltage bias to the write/erase gate while grounding the at least one p-well; and
    performing an erase operation to discharge the floating gate by applying a high erase voltage bias to the at least one p-well while grounding the write/erase gate, wherein the high erase voltage bias may be the same or different voltage than the high write voltage bias.

12. The method of claim 9, wherein the EEPROM cell is a p-channel cell comprising at least one n-well, and the method comprises:
    performing the read operation to read the charge on the floating gate by applying a low read voltage bias to the at least one n-well while grounding the write/erase gate;
    performing the write operation to charge the floating gate by applying a high write voltage bias to the at least one n-well while grounding the write/erase gate; and
    performing an erase operation to discharge the floating gate by applying a high erase voltage bias to the write/erase gate while grounding the at least one n-well, wherein the high erase voltage bias may be the same or different voltage than the high write voltage bias.

13. The method of claim 9, wherein the EEPROM cell includes first and second read gates, and wherein the method comprises independently biasing the first and second read gates.

14. The method of claim 13, wherein the first and second read gates comprise poly spacers located on opposite lateral sides of the floating gate.

15. A memory cell array, comprising:
    a plurality electrically erasable programmable read only memory (EEPROM) cells arranged in an array, each EEPROM cell comprising:
    a substrate including at least one active region;
    a floating gate arranged over the substrate;
    a write/erase gate arranged above the floating gate and defining a write/erase path for performing write and erase operations of the cell; and
    a read gate arranged above the substrate and laterally adjacent to the floating gate and the write/erase gate, the read gate defining a read path for performing read operations of the cell, wherein the read path is distinct from the write/erase path,
    a floating gate oxide between the floating gate and the substrate; and
    a read gate oxide between the read gate and the substrate; wherein the read gate oxide is thinner than the floating gate oxide.

16. The memory cell array of claim 15, wherein:
the array of EEPROM cells comprises a plurality of cell rows; and at least two cell rows share a common source line.

17. The memory cell array of claim 15, wherein for each EEPROM cell: the write/erase gate and the floating gate form a stack and wherein the read gate has a vertical extension extending beyond the vertical extension of the stack.

18. The memory cell array of claim 15, wherein each EEPROM cell comprises: a dielectric hard mask covering the write/erase gate wherein the read gate extends to a top surface of the dielectric hard mask.

19. The memory cell array of claim 15, wherein for each EEPROM cell:
the write/erase path defined by the write/erase gate is configured for high voltage write and erase operations; and
the read path defined by the read gate is configured for low voltage read operations.

20. The memory cell array of claim 15, each EEPROM cell includes first and second read gates that are independently controllable.

21. The method of claim 9, wherein:
the write/erase gate and the floating gate form a stack and wherein the read gate has a vertical extension extending beyond the vertical extension of the stack.

22. The method of claim 21, comprising:
a dielectric hard mask covering the write/erase gate wherein the read gate extends to a top surface of the dielectric hard mask.

23. The method of claim 9, wherein the read gate comprises bent or winding in order to provide an increased contact area for electrical contact.

24. The method of claim 23, wherein read gate contact are provided having a contact surface covering the bent of winding of the read gate.

25. The EEPROM cell of claim 1, wherein the read gate comprises bent or winding in order to provide an increased contact area for electrical contact.

26. The EEPROM cell of claim 25, wherein read gate contact are provided having a contact surface covering the bent of winding of the read gate.

* * * * *